(12) United States Patent
Ide

(10) Patent No.: US 6,316,748 B1
(45) Date of Patent: Nov. 13, 2001

(54) APPARATUS FOR MANUFACTURING A SEMICONDUCTOR DEVICE

(75) Inventor: Shigeaki Ide, Kumamoto (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/664,386

(22) Filed: Sep. 18, 2000

(30) Foreign Application Priority Data

Sep. 17, 1999 (JP) .................................................. 11-263057

(51) Int. Cl.$^7$ ....................................................... F27D 11/00
(52) U.S. Cl. ........................ 219/390; 219/405; 219/411; 118/724; 118/50.1; 392/416
(58) Field of Search ..................... 219/390, 405, 219/411; 118/724, 725, 50.1; 392/416, 418

(56) References Cited

U.S. PATENT DOCUMENTS

| | | | | |
|---|---|---|---|---|
| 3,909,590 | * | 9/1975 | Jensen et al. ........................ | 219/390 |
| 4,233,937 | * | 11/1980 | Steube .................................. | 118/727 |
| 4,846,101 | * | 7/1989 | Montgomery et al. ............... | 118/723 |
| 4,949,671 | * | 8/1990 | Davis et al. .......................... | 118/725 |
| 5,217,501 | * | 6/1993 | Fuse et al. ........................... | 29/25.01 |
| 5,232,506 | * | 8/1993 | Kawase ................................ | 118/719 |
| 5,336,325 | * | 8/1994 | Devilbiss et al. .................... | 118/719 |
| 5,520,742 | * | 5/1996 | Ohkase ................................. | 118/724 |
| 5,763,856 | * | 6/1998 | Ohkase ................................. | 219/390 |
| 5,972,116 | * | 10/1999 | Takagi ................................. | 118/719 |
| 6,107,212 | * | 8/2000 | Fujita ................................... | 438/758 |

* cited by examiner

Primary Examiner—Teresa Walberg
Assistant Examiner—Shawntina T. Fuqua
(74) Attorney, Agent, or Firm—Young & Thompson

(57) ABSTRACT

An apparatus for manufacturing semiconductor devices includes a main chamber with a main heater for heating the main chamber and a single preliminary chamber, which is cylindrically shaped and is provided under the main chamber. The preliminary chamber is separated by a shutter from the main chamber and has a preliminary heater for heating the preliminary chamber. The preliminary chamber has at least a pair of doors.

8 Claims, 8 Drawing Sheets

APPARATUS FOR MANUFACTURING A SEMICONDUCTOR DEVICE

BACKGROUND OF THE INVENTION

The present invention relates to an apparatus for manufacturing a semiconductor device and a method of for manufacturing a semiconductor device by use of the apparatus.

Figure 1:
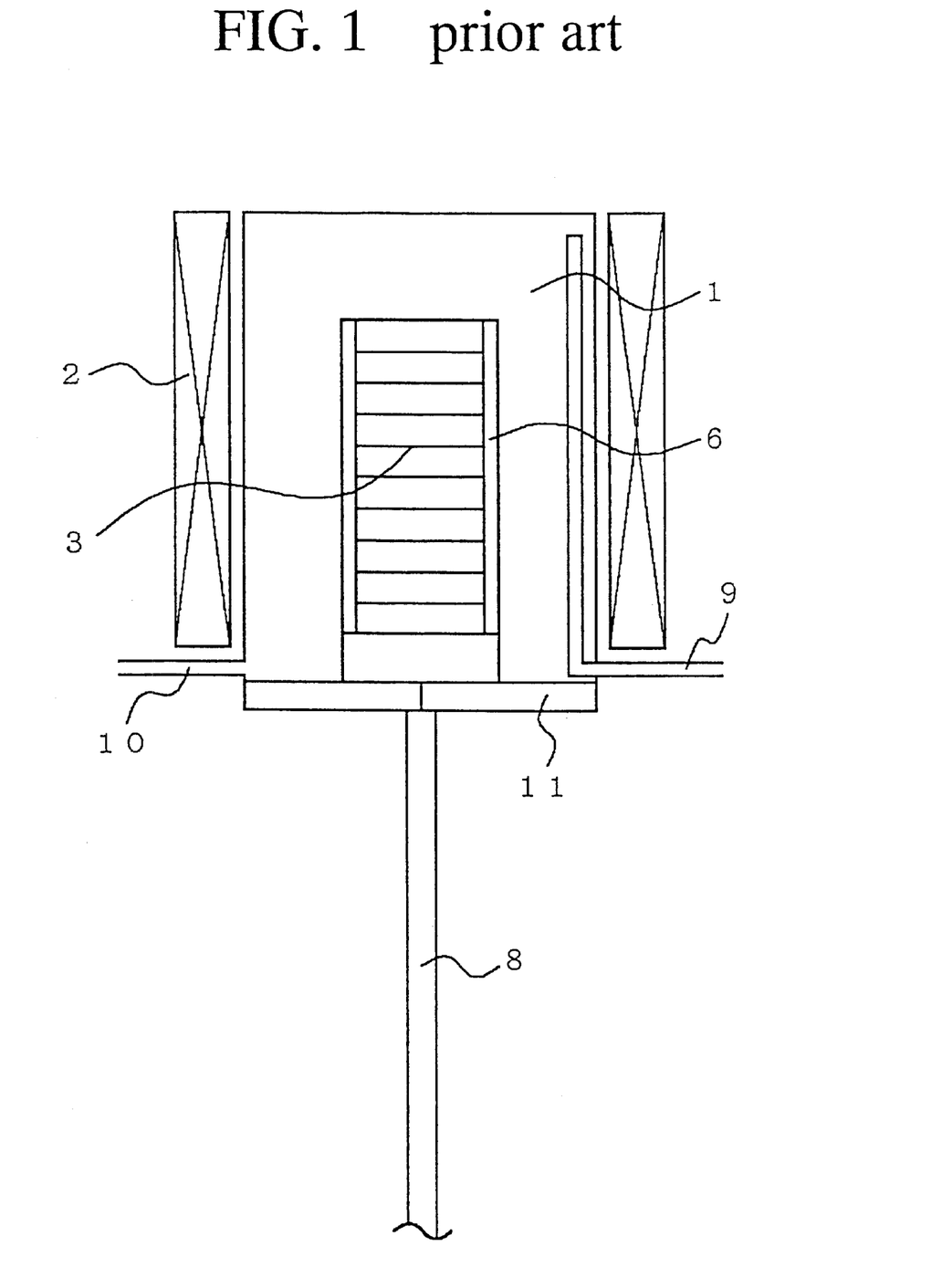
FIG. 1 is a schematic cross sectional elevation view illustrative of the conventional apparatus for manufacturing the semiconductor device.

The conventional apparatus for manufacturing the semiconductor device is used to carry out a heat treatment to a semiconductor wafer or to form a thin film over the semiconductor wafer. FIG. 1 is a schematic cross sectional elevation view illustrative of the conventional apparatus for manufacturing the semiconductor device. The conventional apparatus for manufacturing the semiconductor device has the following elements. A chamber 1 is provided for treating semiconductor wafers. The chamber 1 may comprise a quartz-based cylindrically shaped chamber. A heater 2 is provided around a side wall of the cylindrically shaped chamber 1. A quartz boat 6 is accommodated in the cylindrically shaped chamber 1 for mounting plural semiconductor wafers 3. A gas supply type 9 is provided and a gas discharge tube is also provided. A shutter 11 is also provided on a bottom portion of the cylindrically shaped chamber 1. A boat elevator 8 is provided which has a top portion which supports the bottom of the quartz boat 6. A stainless steal scavenger stores the quartz boat 6. The boat elevator 8 is used to move the quartz boat 6 mounting the semiconductor wafers 3 at a speed in the range of 10–20 cm/min. between the stainless steal scavenger and the cylindrically shaped chamber 1, where the cylindrically shaped chamber 1 is heated at a temperature in the range of 700–1200° C. The quartz boat 6 has multiple stages on which the plural semiconductor wafers 3 are mounted. A top level stage of the quartz boat 6 firstly enters into the cylindrically shaped chamber 1 and also finally come out the cylindrically shaped chamber 1. A bottom level stage of the quartz boat 6 finally enters into the cylindrically shaped chamber 1 and also firstly come out the cylindrically shaped chamber 1. This means that the semiconductor wafer mounted on the top level stage of the quartz boat 6 is subjected to the heat treatment in the cylindrically shaped chamber 1 for a longest time, whilst the semiconductor wafer mounted on the bottom level stage of the quartz boat 6 is subjected to the heat treatment in the cylindrically shaped chamber 1 for a shortest time. A difference is caused in the time duration for subjecting the wafer to the heat treatment between the semiconductor wafers 3 over position, whereby a variation in characteristic or performance is caused between the semiconductor wafers 3.

Figure 2:
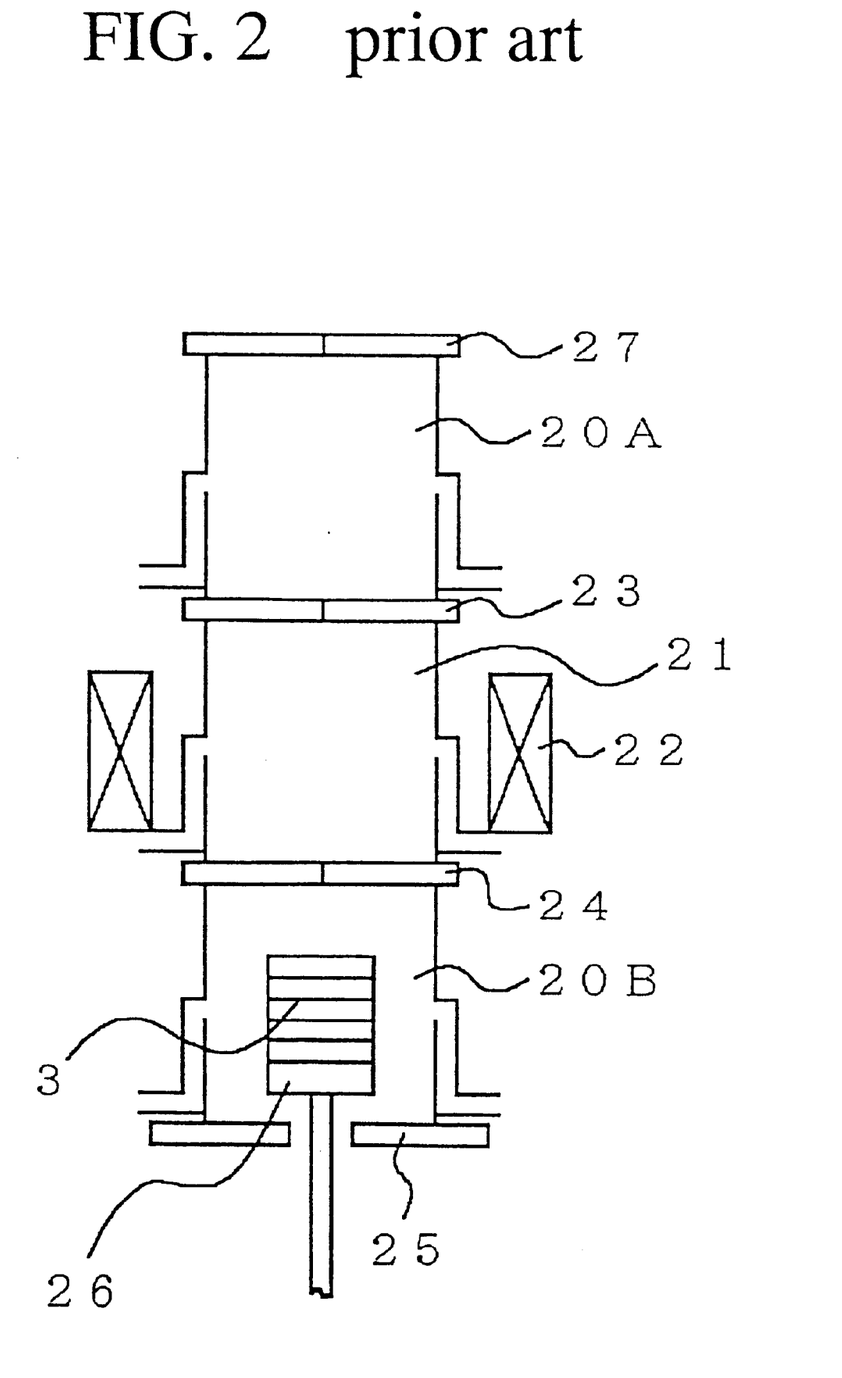
FIG. 2 is a schematic cross sectional view illustrative of the second conventional apparatus for manufacturing the semiconductor device.

Japanese laid-open patent publication No. 4-297025 discloses a second conventional apparatus for manufacturing the semiconductor device. FIG. 2 is a schematic cross sectional view illustrative of the second conventional apparatus for manufacturing the semiconductor device. A cylindrically shaped main chamber 21 is provided for carrying out a heat treatment to a semiconductor wafer. A heater 22 is also provided around a side wall of the cylindrically shaped main chamber 21. An upper shutter 23 is provided on the top portion of the cylindrically shaped main chamber 21. A lower shutter 24 is provided on the bottom portion of the cylindrically shaped main chamber 21. A wafer boat 26 is provided which has multiple stages for mounting plural semiconductor wafers 3. The wafer boat 26 is supported by a boat elevator 8. A cylindrically shaped top preliminary chamber 20A is further provided over the cylindrically shaped main chamber 21, wherein the cylindrically shaped top preliminary chamber 20A and the cylindrically shaped main chamber 21 are separated from each other by the above upper shutter 23. The bottom portion of the cylindrically shaped top preliminary chamber 20A is separated by the above upper shutter 23 from the top potion of the cylindrically shaped main chamber 21. A top shutter 27 is also provided on the top portion of the cylindrically shaped top preliminary chamber 20A. A cylindrically shaped bottom preliminary chamber 20B is further provided under the cylindrically shaped main chamber 21, wherein the cylindrically shaped bottom preliminary chamber 20B and the cylindrically shaped main chamber 21 are separated from each other by the above lower shutter 24. The top portion of the cylindrically shaped bottom preliminary chamber 20B is separated by the above lower shutter 24 from the bottom potion of the cylindrically shaped main chamber 21. A bottom shutter 25 is also provided on the bottom portion of the cylindrically shaped bottom preliminary chamber 20B. In a first step, the bottom shutter 25 is opened to enter the wafer boat 26 into the cylindrically shaped bottom preliminary chamber 20B and then the bottom shutter 25 is closed. In a second step, the lower shutter 24 is opened to move the wafer boat 26 from the cylindrically shaped bottom preliminary chamber 20B to the cylindrically shaped main chamber 21 and then the lower shutter 24 is closed for subsequent heat treatment to the semiconductor wafers 3 amounted on the wafer boat 26. After the heat treatment was carried out, the upper shutter 23 is opened to move the wafer boat 26 from the cylindrically shaped main chamber 21 into the cylindrically shaped top preliminary chamber 20A. This second conventional apparatus for manufacturing the semiconductor device is free from the above problem engaged with the first conventional apparatus. Namely, a top level stage of the wafer boat 26 firstly enters into the cylindrically shaped main chamber 21 and also firstly come out the cylindrically shaped main chamber 21. A bottom level stage of the wafer boat 26 finally enters into the cylindrically shaped chamber 1 and also finally come out the cylindrically shaped main chamber 1. This means that no difference is caused in the time duration for subjecting the wafer to the heat treatment between the semiconductor wafers 3 over position, whereby no variation in characteristic or performance is caused between the semiconductor wafers 3. The above second conventional apparatus has the two preliminary chambers, for which reason the above second conventional apparatus is much higher in height than the first conventional apparatus. Namely, a high roof of a storage room for installing the apparatus is necessary. Otherwise, it is necessary to reduce the height of each of the cylindrically shaped main chamber 21 and the top and bottom preliminary chambers 20A and 20B. This reduction in the height of each of the cylindrically shaped main chamber 21 and the top and bottom preliminary chambers 20A and 20B requires a reduction in height of the wafer boat 26 or reduction in the number of the multiple stages for mounting the wafers. Namely, the number of the semiconductor wafers 3 mounted on the single wafer boat 26 is reduced. A productivity of the semiconductor device is thus reduced.

Figure 3:
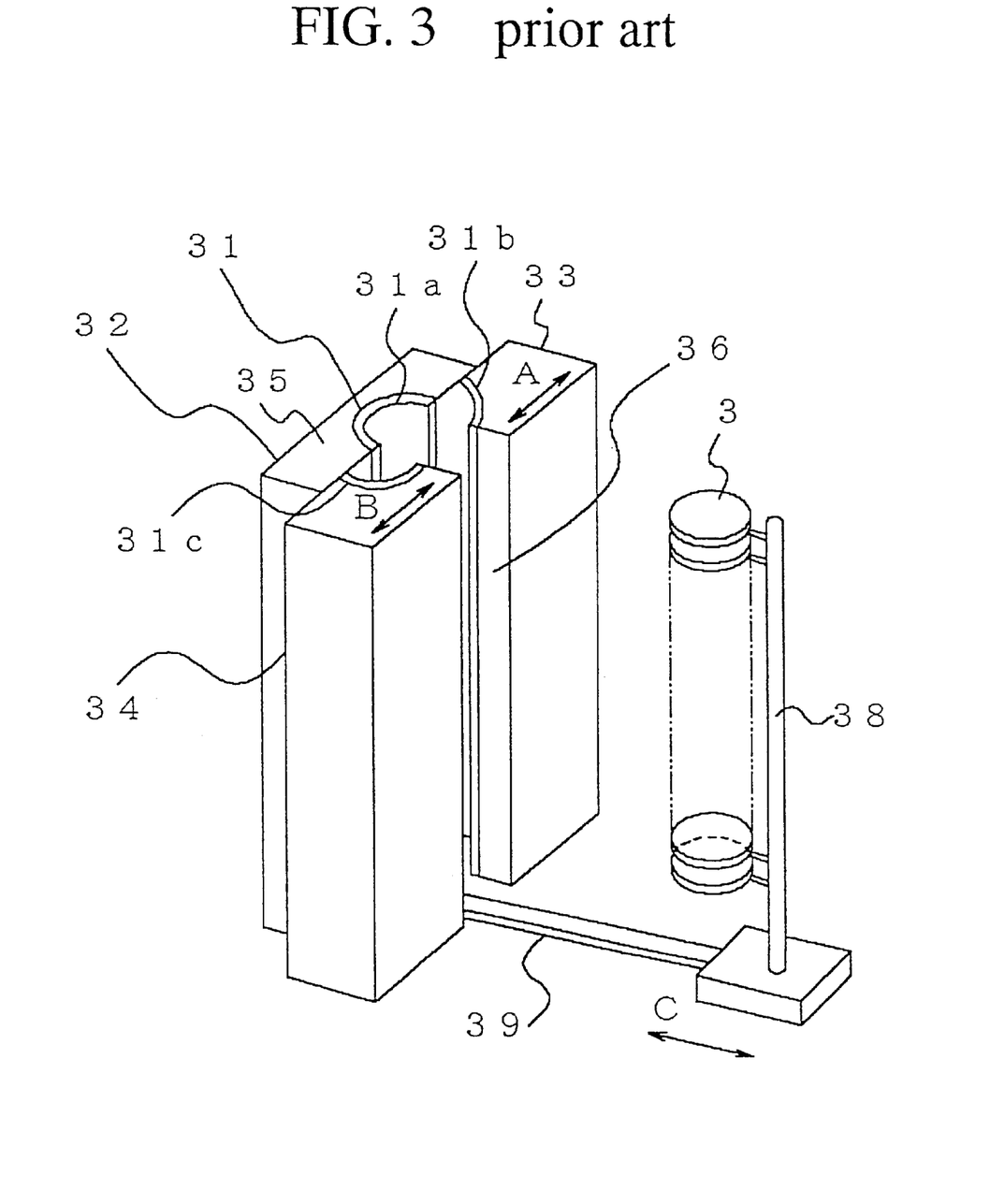
FIG. 3 is a schematic perspective view illustrative of the third conventional apparatus for manufacturing the semiconductor device.

Japanese laid-open patent publication No. 6-349752 discloses a third conventional apparatus for manufacturing a semiconductor device FIG. 3 is a schematic perspective view illustrative of the third conventional apparatus for manufacturing the semiconductor device. A reactor 35 is provided which has a cylindrically shaped reactor core 31 which extends in a vertical direction. The reactor 35 comprises a rear portion and a front portion, wherein a rear half of the cylindrically shaped reactor core 31 is formed in the rear portion of the reactor 35 and a front half of the cylindrically shaped reactor core 31 is formed in the front portion of the reactor 35. The rear portion of the reactor 35 has a heater 35. The front portion of the reactor 35 comprises a pair of doors 33 and 34 to make an opening 36 between them. Namely, the doors 33 and 34 may slide in the direction parallel to the arrow marks "A" and "B" and on the rear portion of the reactor 35. The opening 36 between the opened doors 33 and 34 extends along a longitudinal center axis of the cylindrically shaped reactor core 31. Namely, a rear half portion 31a of the cylindrically shaped reactor core 31 is formed in the rear portion of the reactor 35. A front right quarter portion 31b of the cylindrically shaped reactor core 31 is formed in the right door 33. A front left quarter portion 31c of the cylindrically shaped reactor core 31 is formed in the left door 34. A wafer boat 38 is provided which extends along the longitudinal center axis of the cylindrically shaped reactor core 31. The wafer boat 38 has multiple stages for mounting the semiconductor wafers 3 which are aligned along the longitudinal center axis of the cylindrically shaped reactor core 31. The bottom of the wafer boat 38 is connected with a driver mechanism 39 for moving the wafer boat 38. The above pared doors 33 and 34 comprising the front part of the reactor 31 are opened to make the opening 36 so that the driver mechanism 39 is operated to move the wafer boat 38 mounting the semiconductor wafers 3 to the rear half portion 31a of the cylindrically shaped reactor core 31 formed in the rear portion of the reactor 35. The paired doors 33 and 34 are then closed so that the wafer boat 38 mounting the semiconductor wafers 3 are accommodated in the cylindrically shaped reactor core 31. This third conventional apparatus for manufacturing the semiconductor device is also free from the above problem engaged with the first conventional apparatus. Namely, all of the stages of the wafer boat 38 concurrently enter into the cylindrically shaped main chamber 21 and also firstly come out the cylindrically shaped reactor core 31. This means that no difference is caused in the time duration for subjecting the wafer to the heat treatment between the semiconductor wafers 3 over position, whereby no variation in characteristic or performance is caused between the semiconductor wafers 3. However, a far portion of each wafer from the wafer boat 38 firstly enters into the cylindrically shaped reactor core 31, whilst a close portion of each wafer to the wafer boat 38 finally enters into the cylindrically shaped reactor core 31. A difference is caused in the time duration of receiving the heat treatment between the far portion of each wafer from the wafer boat 38 and the close portion of each wafer to the wafer boat 38. Namely, a in-plane variation in the time of receiving the heat treatment is caused between the lateral position for each wafer, even no variation in the time of receiving the heat treatment is caused between the wafers. Further, the heater 35 is not ring-shaped. The heater 35 is unwillingly discontinued at the opening portion 36 between the paired doors 33 and 34, whereby the heater 35 is incapable of a uniform heating property around the cylindrically shaped reactor core 31. This causes a variation in the amount of receiving the heat over position for each wafer.

In the above circumstances, it had been required to develop a novel apparatus for manufacturing a semiconductor device free from the above problem.

SUMMARY OF THE INVENTION

Accordingly, it is an object of the present invention to provide a novel apparatus for manufacturing a semiconductor device free from the above problems.

It is a further object of the present invention to provide a novel apparatus for manufacturing a semiconductor device, wherein the apparatus is free of any substantive enlargement in size.

It is a still further object of the present invention to provide a novel apparatus for manufacturing a semiconductor device, wherein the apparatus is free of any substantive reduction in productivity.

It is yet a further object of the present invention to provide a novel apparatus for manufacturing a semiconductor device, wherein the apparatus is free of any substantive reduction in throughput.

It is yet a further object of the present invention to provide a novel apparatus for manufacturing a semiconductor device, wherein the apparatus is capable of a substantially uniform heat treatment.

The present invention provides an apparatus for manufacturing semiconductor devices. The apparatus comprises: a main chamber with a main heater for heating the main chamber; and a single preliminary chamber being cylindrically shaped and being provided under the main chamber, the single preliminary chamber being separated by a shutter from the main chamber, and the single preliminary chamber having a preliminary heater for heating the single preliminary chamber, the single preliminary chamber having at least a pair of doors which form a part of the single preliminary chamber.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

The present invention provides an apparatus for manufacturing semiconductor devices. The apparatus comprises: a main chamber with a main heater for heating the main chamber; and a single preliminary chamber being cylindrically shaped and being provided under the main chamber, the single preliminary chamber being separated by a shutter from the main chamber, and the single preliminary chamber having a preliminary heater for heating the single preliminary chamber, the single preliminary chamber having at least a pair of doors which form a part of the single preliminary chamber.

It is preferable that the single preliminary chamber comprises a first half-cylinder shaped part and a second half-cylinder shaped part, and the at least one pair of doors forms the second half-cylinder shaped part.

It is further preferable that at least one pair of hinges is further provided at opposite sides of the first half-cylinder shaped part for connecting the at least one pair of doors to the opposite sides of the first half-cylinder shaped part, so that the at least one pair of doors are hinged to the first half-cylinder shaped part.

It is also preferable that at least one pair of arched door rails is further provided along the second half-cylinder shaped part for allowing the at least one pair of doors to slide on the arched door rails, so that the at least one pair of doors are movable around the first half-cylinder shaped part to open the at least one pair of doors.

It is also preferable that at least one pair of straight door rails is further provided at opposite sides of the first half-cylinder shaped part and extends in diametrical and anti-parallel directions for allowing the at least one pair of doors to slide on the straight door rails, so that the at least one pair of doors are movable in the diametrical and anti-parallel directions.

It is also preferable that the preliminary heater is capable of heating the single preliminary chamber up to substantially the same temperature as the main chamber.

It is also preferable that the preliminary heater is provided around a side wall of the single preliminary chamber.

It is also preferable that the semiconductor wafers are mounted on a wafer boat which is moved by a boat elevator between the main chamber and the preliminary chamber, and the at least one pair of doors is opened to allow the semiconductor wafers are picked up from the wafer boat set in the preliminary chamber.

Preferred Embodiment

Figure 4:
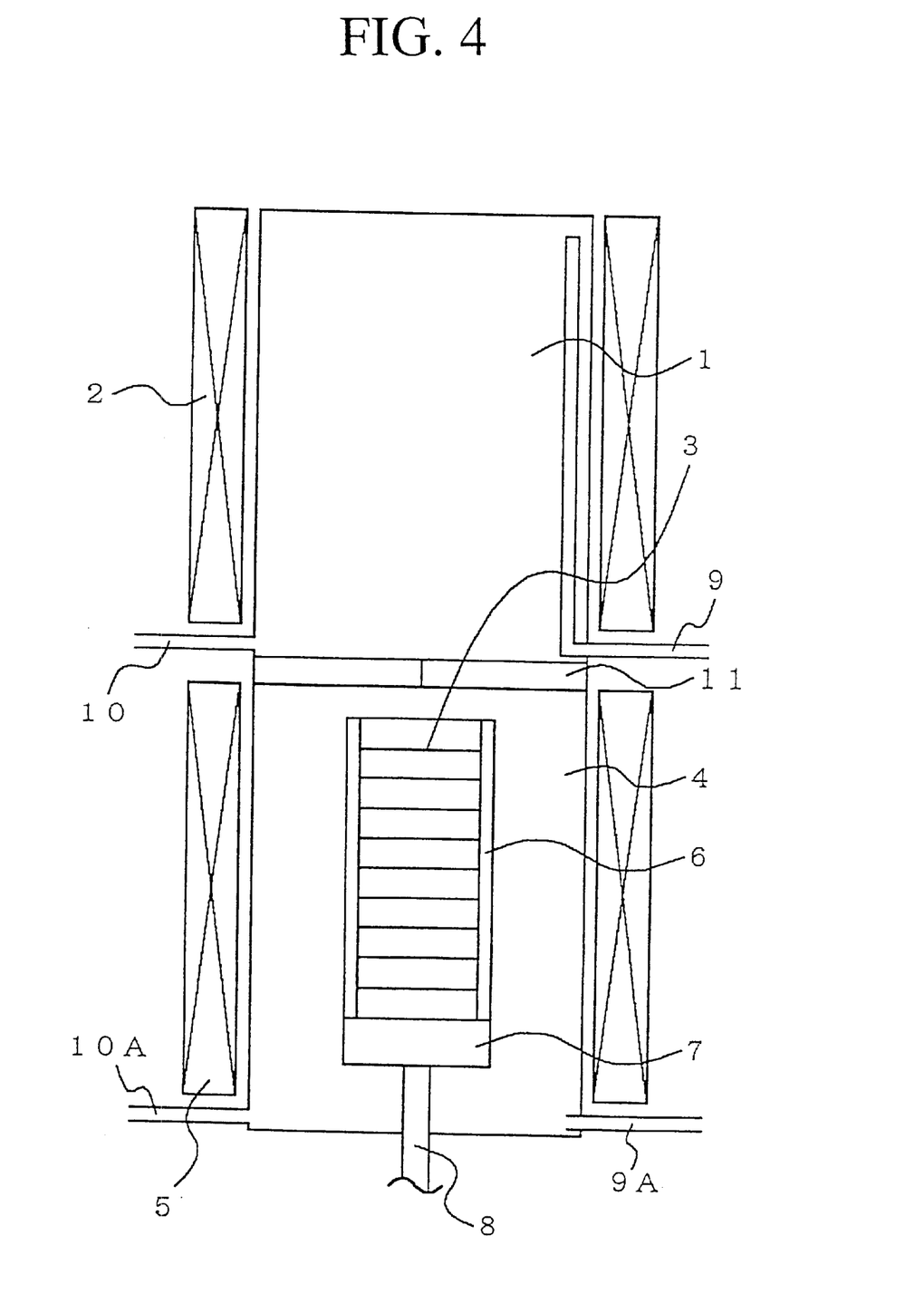
FIG. 4 is a schematic cross sectional elevation view illustrative of a first novel apparatus for manufacturing a semiconductor device in a first embodiment in accordance with the present invention, wherein the apparatus has a main chamber and a preliminary chamber and a wafer boat mounting plural semiconductor wafers has entered in the preliminary chamber.
Figure 5:
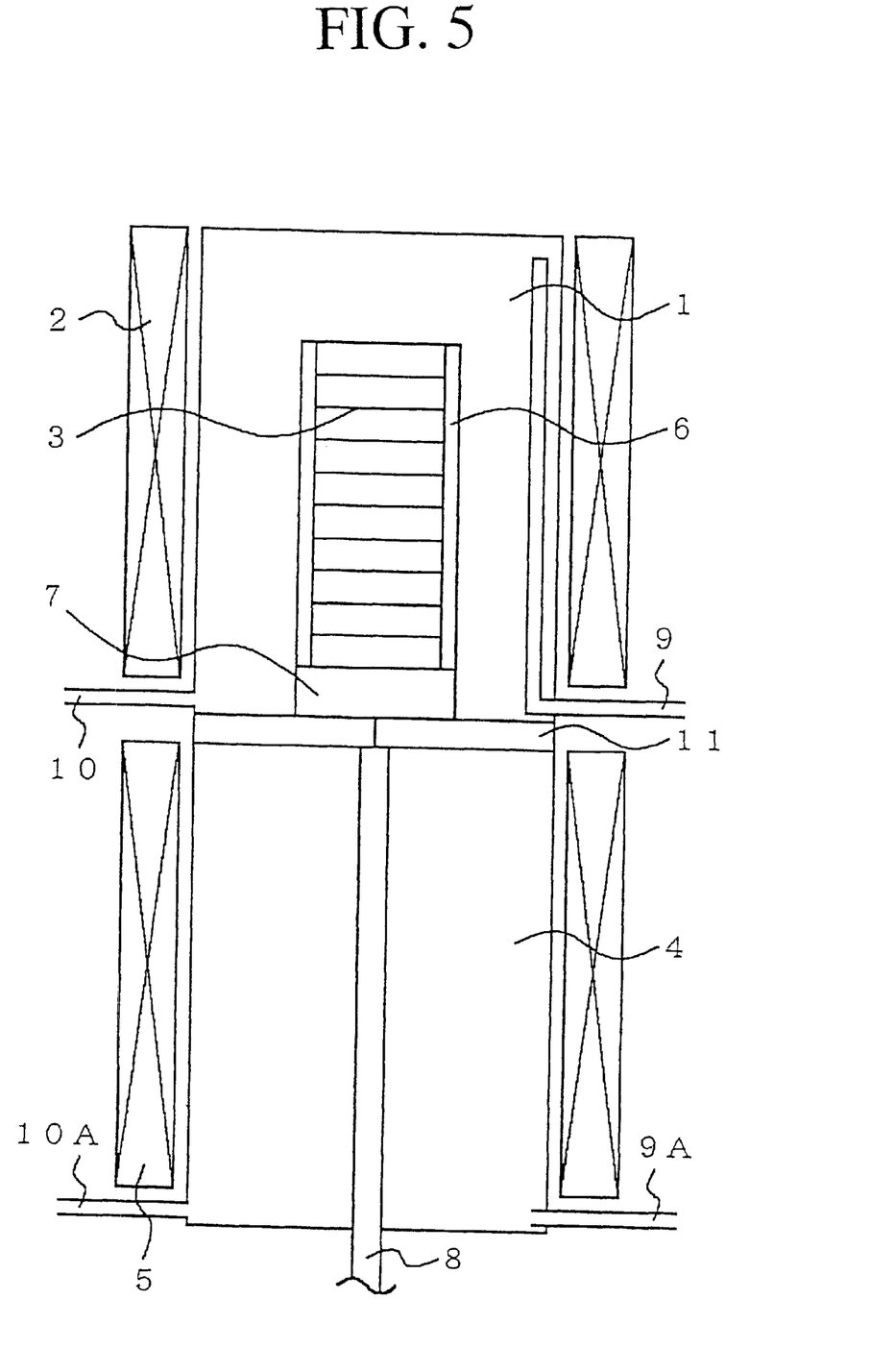
FIG. 5 is a schematic cross sectional elevation view illustrative of the first novel apparatus for manufacturing a semiconductor device of FIG. 4, wherein the wafer boat mounting plural semiconductor wafers has entered in the main chamber.
Figure 6:
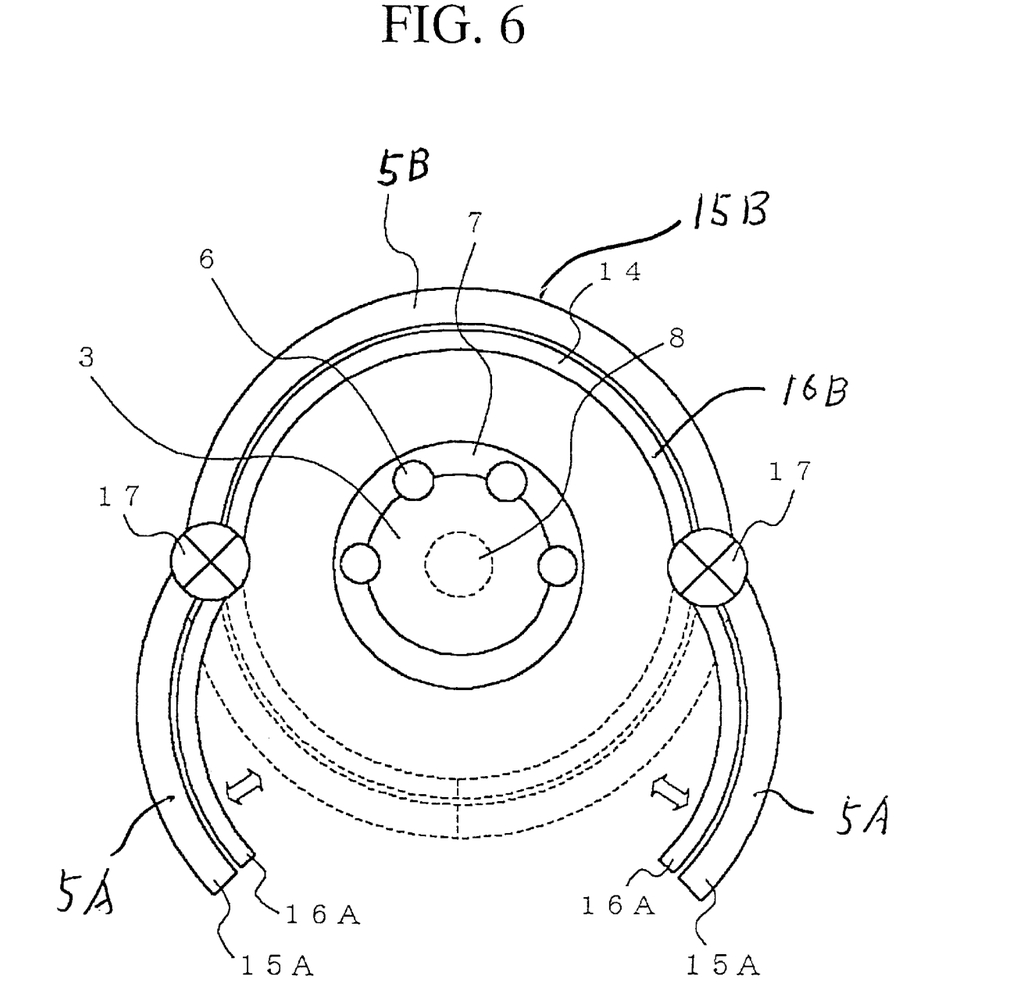
FIG. 6 is a top view illustrative of a first preferable structure of the preliminary chamber of the first novel apparatus for manufacturing a semiconductor device of FIGS. 4 and 5 in the first embodiment in accordance with the present invention.

A first embodiment according to the present invention will be described in detail with reference to the drawings. FIG. 4 is a schematic cross sectional elevation view illustrative of a first novel apparatus for manufacturing a semiconductor device in a first embodiment in accordance with the present invention, wherein the apparatus has a main chamber and a preliminary chamber and a wafer boat mounting plural semiconductor wafers has entered in the preliminary chamber. FIG. 5 is a schematic cross sectional elevation view illustrative of the first novel apparatus for manufacturing a semiconductor device of FIG. 4, wherein the wafer boat mounting plural semiconductor wafers has entered in the man chamber. FIG. 6 is a top view illustrative of a first preferable structure of the preliminary chamber of the first novel apparatus for manufacturing a semiconductor device of FIGS. 4 and 5 in the first embodiment in accordance with the present invention.

The first novel apparatus for manufacturing a semiconductor device has the following structure. A cylindrically shaped main chamber 1 is provided for carrying out a heat treatment to one or more semiconductor wafers or forming thin films on the semiconductor wafers. A main heater 2 is provided around a side wall of the cylindrically shaped main chamber 1. A main gas supply tube 9 is also provided for supplying a gas to an internal space of the cylindrically shaped main chamber 1. A main discharge tube 10 is provided for discharging the used gas from the internal space of the cylindrically shaped main chamber 1. A cylindrically shaped preliminary chamber 4 is further provided under the cylindrically shaped main chamber 1. The cylindrically shaped preliminary chamber 4 is separated by a shutter 11 from the cylindrically shaped main chamber 1. A preliminary heater 5 is provided around a side wall of the cylindrically shaped preliminary chamber 4. A preliminary gas supply tube 9A is also provided for supplying a gas to an internal space of the cylindrically shaped preliminary chamber 4. A preliminary discharge tube 10A is provided for discharging the used gas from the internal space of the cylindrically shaped preliminary chamber 4. A wafer boat 6 is provided which has multiple stages for mounting plural semiconductor wafers 3. The wafer boat 6 is made of quartz. The wafer boat 6 is supported by a boat supporter 7 which is connected to a top of a boat elevator 8 for elevating the wafer boat 6. The boat elevator 8 moves the wafer boat 6 so that the wafer boat 6 comes into the cylindrically shaped preliminary chamber 4 and further after the shutter 11 is opened, then the wafer boat 6 comes into the cylindrically shaped main chamber 1 for the required heat treatment to the wafers 3 on the wafer boat 6.

As shown in FIG. 6, the cylindrically shaped preliminary chamber 4 comprises a rear part 15B and a front part 15A, wherein the front part 15A further comprises casement doors or hinged double doors 15A. Namely, the rear part 15B of the cylindrically shaped preliminary chamber 4 has a half-cylinder shape. The front part 15A of the cylindrically shaped preliminary chamber 4 also has a half-cylinder shape. When the hinged double doors 15A are closed, the closed hinged double doors 1SA form the front part 15A of the half-cylinder shape. Each of the hinged double doors 15A has a quarter-cylinder shape. Opposite sides of the half-cylinder shaped rear part 15B of the cylindrically shaped preliminary chamber 4 have hinges 17, each of which is also connected with one side of each of the hinged double doors 15A. The hinged double doors 15A are hinged by the hinges 17 to the opposite sides of the half-cylinder shaped rear part 15B of the cylindrically shaped preliminary chamber 4. The preliminary heater 5 comprises a rear heater 5B and double front heaters 5A. The rear heater 5B is provided in the front part 15A of the cylindrically shaped preliminary chamber 4. The double front heaters 5A are provided in the hinged double doors 15A or the front part 15A of the cylindrically shaped preliminary chamber 4. A cylindrically shaped preliminary chamber core tube 14 is provided along an inner wall of the cylindrically shaped preliminary chamber 4. The cylindrically shaped preliminary chamber core tube 14 comprises front core tube parts 16A and a rear core tube part 16B. Each of the front core tube parts 16A has a quarter-cylinder shape. The rear core tube part 16B has a half-cylinder shape. Each of the front core tube parts 16A extends along the inner wall of the quarter-cylinder shaped hinged double doors 15A of the cylindrically shaped preliminary chamber 4. The rear core tube part 16B extends along the inner wall of the half-cylinder shaped rear part 15B of the cylindrically shaped preliminary chamber 4. The front core tube parts 16A are also hinged by the hinges 17 so that the front core tube parts 16A are so moved as united with the hinged double doors 15A. A silicon carbide heat conductive tube not illustrated is provided between the cylindrically shaped preliminary chamber core tube 14 and the heater 5 for realizing a uniform heat conduction to the cylindrically shaped preliminary chamber core tube 14 circumferentially. The hinged double doors 15A are opened and closed around the hinges 17 which are positioned at diametrically opposite positions of the cylindrically shaped preliminary chamber 4. When the hinged double doors 15A are opened, a large opening is formed in the front side of the cylindrically shaped preliminary chamber 4, so that plural semiconductor wafers 3 are mounted on the wafer boat 6 from the opening in the front side of the cylindrically shaped preliminary chamber 4, before the hinged double doors 15A are then closed. The stutter 11 is then opened to move the wafer boat 6 mounting the plural semiconductor wafers 3 from the cylindrically shaped preliminary chamber 4 to the cylindrically shaped main chamber 1 by the boat elevator 8 before the shutter 11 is closed for subsequently carrying our the required heat treatment to the semiconductor wafers 3 or the deposition process for forming the polysilicon film or the silicon dioxide film over the semiconductor wafer. Thereafter, the shutter 11 is again opened to move the wafer boat 6 from the cylindrically shaped main chamber 1 to the cylindrically shaped preliminary chamber 4 before the shutter 11 is closed. Further, the hinged double doors 15A are opened to pick up the semiconductor wafers 3 from the wafer boat 6 in the cylindrically shaped preliminary chamber 4.

The above novel apparatus is so operated as follows. As shown in FIG. 4, an inert gas such as nitrogen gas is supplied through the main gas supply tube 9 to fill the cylindrically shaped main chamber 1 with the inert gas to prevent any oxidation to surfaces of the semiconductor wafers 3. The main heater 2 is operated to heat the cylindrically shaped main chamber 1 at a temperature in the range of 700–1200° C. The wafer boat 6 has already set in the cylindrically shaped preliminary chamber 4. When the hinged double doors 15A are opened, a large opening is formed in the front side of the cylindrically shaped preliminary chamber 4, so that plural semiconductor wafers 3 are mounted on the wafer boat 6 from the opening in the front side of the cylindrically shaped preliminary chamber 4, before the hinged double doors 15A are then closed. An inert gas such as nitrogen gas is supplied through the preliminary gas supply tube 9A to fill the cylindrically shaped preliminary chamber 4 with the inert gas to prevent any oxidation to surfaces of the semiconductor wafers 3. The preliminary heater 4 is operated to heat the cylindrically shaped preliminary chamber 1 up to substantially the same temperature as the cylindrically shaped main chamber 1. Any excess gas in the cylindrically shaped preliminary chamber 4 is concurrently discharged through the preliminary discharge tube 10.

As shown in FIG. 5, after the cylindrically shaped preliminary chamber 4 is heated up to substantially the same temperature as the cylindrically shaped main chamber 1, the stutter 11 is then opened. The boat elevator 8 is operated to move the wafer boat 6 from the cylindrically shaped preliminary chamber 4 to the cylindrically shaped main chamber 1. The shutter 11 is closed. Necessary reaction gases or source gases are supplied to the cylindrically shaped main chamber 1 for subsequently carrying our the required heat treatment to the semiconductor wafers 3 or the deposition process for forming the polysilicon film or the silicon dioxide film over the semiconductor wafer 3. Thereafter, the shutter 11 is again opened to move the wafer boat 6 from the cylindrically shaped main chamber 1 to the cylindrically shaped preliminary chamber 4 before the shutter 11 is closed. The temperature of the cylindrically shaped preliminary chamber 4 is dropped to a room temperature. Further, the hinged double doors 15A are opened to pick up the semiconductor wafers 3 from the wafer boat 6 in the cylindrically shaped preliminary chamber 4.

In the above description, the semiconductor wafers 3 are subjected to the heat treatment in the cylindrically shaped main chamber 1. It is possible that the semiconductor wafers 3 are subjected to a deposition process such as chemical vapor deposition process with heating the wafers to deposit insulating layers or polysilicon layers over the semiconductor wafers.

Since the main chamber 1 comprises the quartz cylinder and the heater 2 is ring-shaped heater, a thermal sectioned-uniformity of the main chamber 1 is kept high so that a variation in temperature over circumferential position of the cylindrically shaped chamber 1 is suppressed within ±1° C.

Further, the doors of the cylindrically shaped preliminary chamber 4 are of the hinged double doors 15A, thereby causing no substantive increase in the size of the apparatus.

Furthermore, the provision of the single cylindrically shaped preliminary chamber 4 under the main chamber 1 causes no substantive increase in the height from the conventional apparatus.

Moreover, the single cylindrically shaped preliminary chamber 4 is filled with the inert gas and also heated up to substantially the same temperature as the main chamber 1 before the wafer boat 6 is introduced from the cylindrically shaped preliminary chamber 4 to the main chamber 1 for subsequent heat treatment to the wafers 3 in the main chamber 1, and thereafter, the wafer boat 6 is moved to the preliminary chamber 4 for subsequent cool down the preliminary chamber 4 to room temperature, whereby the amounts of the heat, which the individual semiconductor wafers receive, are made uniform.

Figure 7:
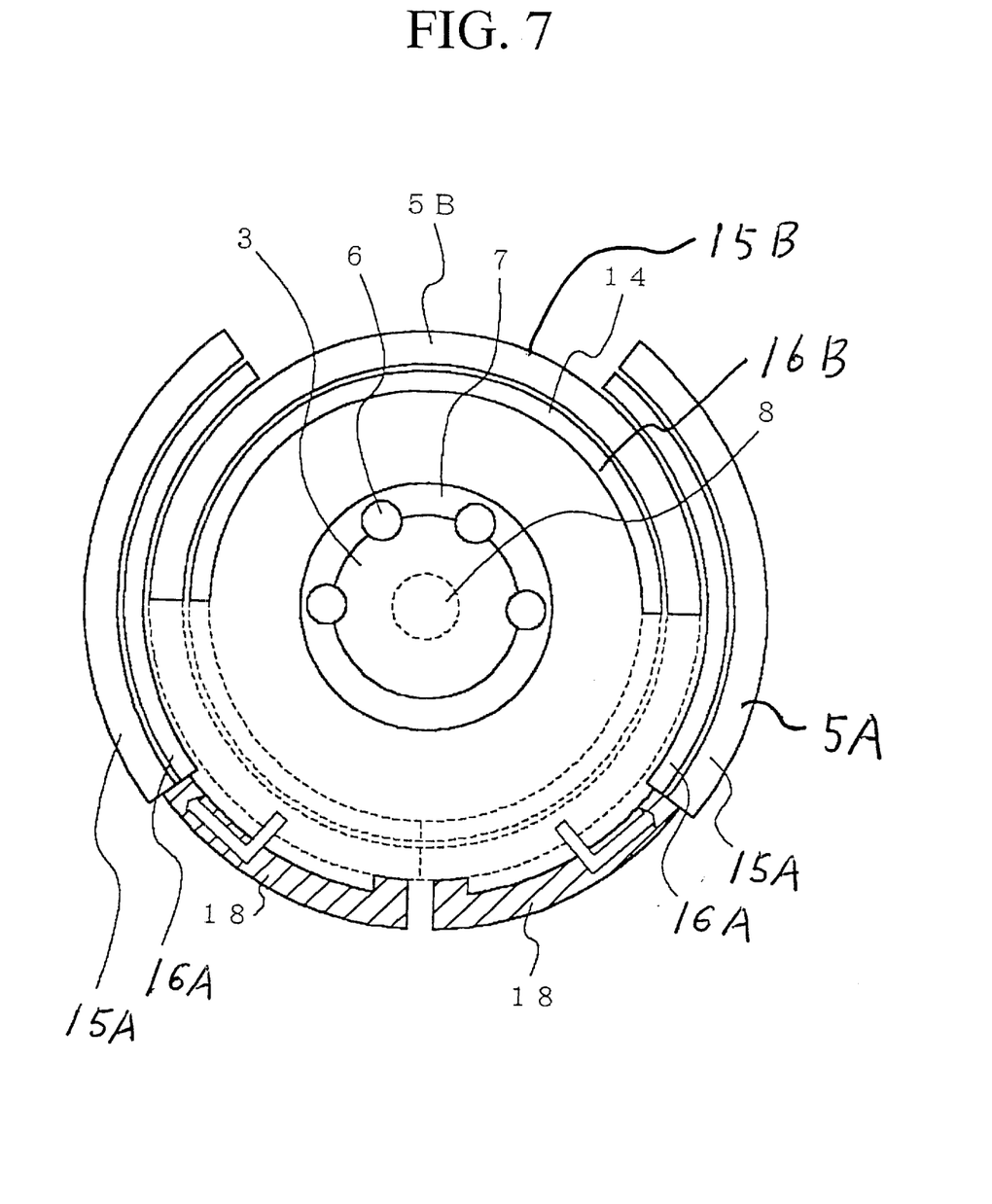
FIG. 7 is a top view illustrative of a second preferable structure of the preliminary chamber of the first novel apparatus for manufacturing a semiconductor device of FIGS. 4 and 5 in the first modification to the first embodiment in accordance with the present invention.

FIG. 7 is a top view illustrative of a second preferable structure of the preliminary chamber of the first novel apparatus for manufacturing a semiconductor device of FIGS. 4 and 5 in the first modification to the first embodiment in accordance with the present invention. As shown in FIG. 7, the cylindrically shaped preliminary chamber 4 comprises a rear part 15B and a front part 15A, wherein the front part 15A further comprises slide double doors 15A. Namely, the rear part 15B of the cylindrically shaped preliminary chamber 4 has a half-cylinder shape. The front part 15A of the cylindrically shaped preliminary chamber 4 also has a half-cylinder shape. When the slide double doors 15A are closed, the closed slide double doors 15A form the front part 15A of the half-cylinder shape. Each of the slide double doors 15A has a quarter-cylinder shape. The front part 15A of the half-cylinder shape of the cylindrically shaped preliminary chamber 4 has a pair of arched door rails 18. The slide double doors 15A are slide on the arched door rails 18. The preliminary heater 5 comprises a rear heater 5B and double front heaters 5A. The rear heater 5B is provided in the front part 15A of the cylindrically shaped preliminary chamber 4. The double front heaters 5A are provided in the slide double doors 15A or the front part 15A of the cylindrically shaped preliminary chamber 4. A cylindrically shaped preliminary chamber core tube 14 is provided along an inner wall of the cylindrically shaped preliminary chamber 4. The cylindrically shaped preliminary chamber core tube 14 comprises front core tube parts 16A and a rear core tube part 16B. Each of the front core tube parts 16A has a quarter-cylinder shape. The rear core tube part 16B has a half-cylinder shape. Each of the front core tube parts 16A extends along the inner wall of the quarter-cylinder shaped slide double doors 15A of the cylindrically shaped preliminary chamber 4. The rear core tube part 16B extends along the inner wall of the half-cylinder shaped rear part 15B of the cylindrically shaped preliminary chamber 4. The front core tube parts 16A are also slide on the arched door rails 18 so that the front core tube parts 16A are so moved as united with the slide double doors 15A. A silicon carbide heat conductive tube not illustrated is provided between the cylindrically shaped preliminary chamber core tube 14 and the heater 5 for realizing a uniform heat conduction to the cylindrically shaped preliminary chamber core tube 14 circumferentially. The slide double doors 15A are opened and closed by sliding on the arched door rails 18. When the slide double doors 15A are opened, a large opening is formed in the front side of the cylindrically shaped preliminary chamber 4, so that plural semiconductor wafers 3 are mounted on the wafer boat 6 from the opening in the front side of the cylindrically shaped preliminary chamber 4, before the slide double doors 15A are then closed. The stutter 11 is then opened to move the wafer boat 6 mounting the plural semiconductor wafers 3 from the cylindrically shaped preliminary chamber 4 to the cylindrically shaped main chamber 1 by the boat elevator 8 before the shutter 11 is closed for subsequently carrying our the required heat treatment to the semiconductor waters 3 or the deposition process for forming the polysilicon film or the silicon dioxide film over the semiconductor wafer. Thereafter, the shutter 11 is again opened to move the wafer boat 6 from the cylindrically shaped main chamber 1 to the cylindrically shaped preliminary chamber 4 before the shutter 11 is closed. Further, the slide double doors 15A are opened to pick up the semiconductor wafers 3 from the wafer boat 6 in the cylindrically shaped preliminary chamber 4.

The above novel apparatus is so operated as follows. As shown in FIG. 4, an inert gas such as nitrogen gas is supplied through the main gas supply tube 9 to fill the cylindrically shaped main chamber 1 with the inert gas to prevent any oxidation to surfaces of the semiconductor wafers 3. The main heater 2 is operated to heat the cylindrically shaped main chamber 1 at a temperature in the range of 700–1200° C. The wafer boat 6 has already set in the cylindrically shaped preliminary chamber 4. When the slide double doors 15A are opened, a large opening is formed in the front side of the cylindrically shaped preliminary chamber 4, so that plural semiconductor wafers 3 are mounted on the wafer boat 6 from the opening in the front side of the cylindrically shaped preliminary chamber 4, before the slide double doors 15A are then closed. An inert gas such as nitrogen gas is supplied through the preliminary gas supply tube 9A to fill the cylindrically shaped preliminary chamber 4 with the inert gas to prevent any oxidation to surfaces of the semiconductor wafers 3. The preliminary heater 4 is operated to heat the cylindrically shaped preliminary chamber 1 up to substantially the same temperature as the cylindrically shaped main chamber 1. Any excess gas in the cylindrically shaped preliminary chamber 4 is concurrently discharged through the preliminary discharge tube 10.

As shown in FIG. 5, after the cylindrically shaped preliminary chamber 4 is heated up to substantially the same temperature as the cylindrically shaped main chamber 1, the stutter 11 is then opened. The boat elevator 8 is operated to move the wafer boat 6 from the cylindrically shaped preliminary chamber 4 to the cylindrically shaped main chamber 1. The shutter 11 is closed. Necessary reaction gases or source gases are supplied to the cylindrically shaped main chamber 1 for subsequently carrying our the required heat treatment to the semiconductor wafers 3 or the deposition process for forming the polysilicon film or the silicon dioxide film over the semiconductor wafer 3. Thereafter, the shutter 11 is again opened to move the wafer boat 6 from the cylindrically shaped main chamber 1 to the cylindrically shaped preliminary chamber 4 before the shutter 11 is closed. The temperature of the cylindrically shaped preliminary chamber 4 is dropped to a room temperature. Further, the slide double doors 15A are opened to pick up the semiconductor wafers 3 from the wafer boat 6 in the cylindrically shaped preliminary chamber 4.

In the above description, the semiconductor wafers 3 are subjected to the heat treatment in the cylindrically shaped main chamber 1. It is possible that the semiconductor wafers 3 are subjected to a deposition process such as chemical vapor deposition process with heating the wafers to deposit insulating layers or polysilicon layers over the semiconductor wafers.

Since the main chamber 1 comprises the quartz cylinder and the heater 2 is ring-shaped heater, a thermal sectioned-uniformity of the main chamber 1 is kept high so that a variation in temperature over circumferential position of the cylindrically shaped chamber 1 is suppressed within ±1° C.

Further, the doors of the cylindrically shaped preliminary chamber 4 are of the slide double doors 15A, thereby causing no substantive increase in the size of the apparatus.

Furthermore, the provision of the single cylindrically shaped preliminary chamber 4 under the main chamber 1 causes no substantive increase in the height from the conventional apparatus.

Figure 8:
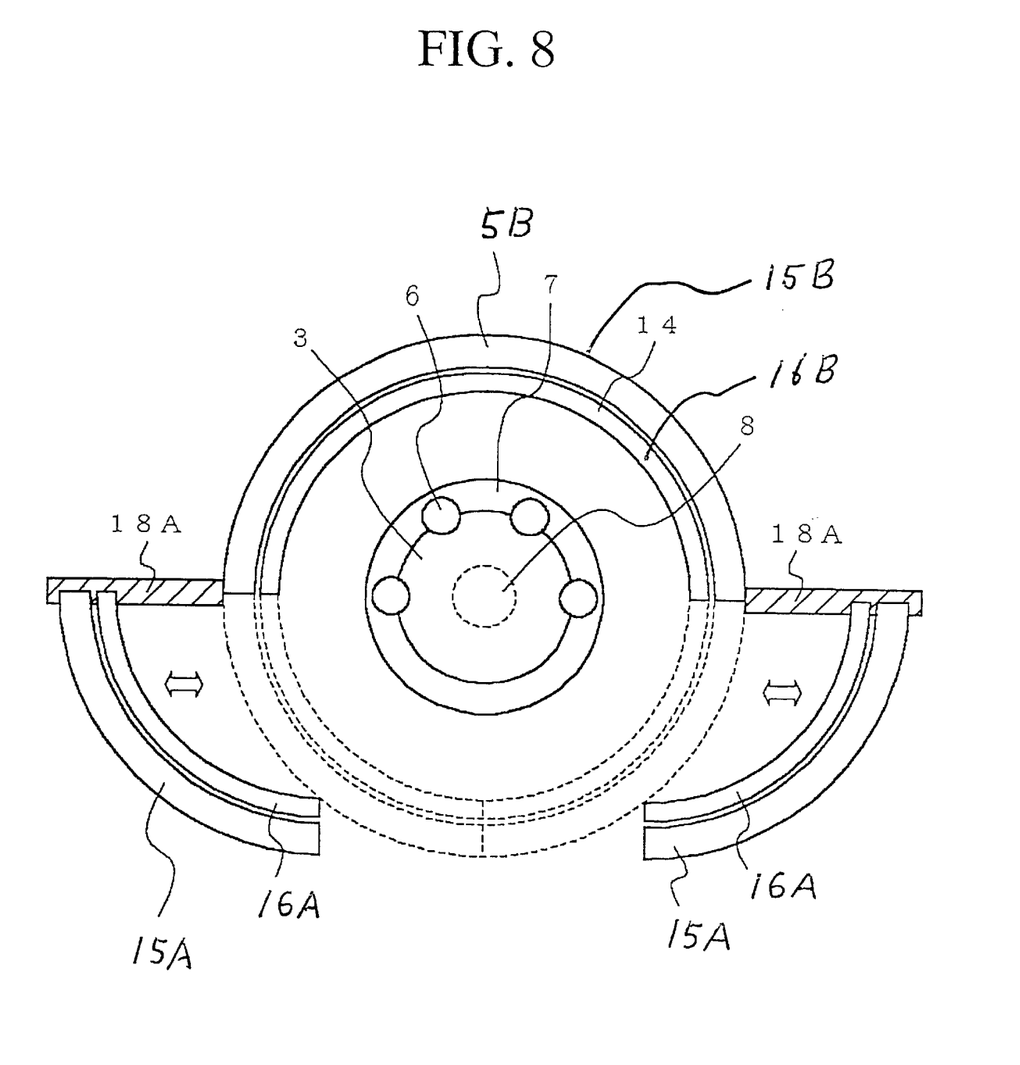
FIG. 8 is a top view illustrative of a third preferable structure of the preliminary chamber of the first novel apparatus for manufacturing a semiconductor device of FIGS. 4 and 5 in the second modification to the first embodiment in accordance with the present invention.

Moreover, the single cylindrically shaped preliminary chamber 4 is filled with the inert gas and also heated up to substantially the same temperature as the main chamber 1 before the wafer boat 6 is introduced from the cylindrically shaped preliminary chamber 4 to the main chamber 1 for subsequent heat treatment to the wafers 3 in the main chamber 1, and thereafter, the wafer boat 6 is moved to the preliminary chamber 4 for subsequent cool down the preliminary chamber 4 to room temperature, whereby the amounts of the heat, which the individual semiconductor wafers receive, are made uniform. FIG. 8 is a top view illustrative of a third preferable structure of the preliminary chamber of the first novel apparatus for manufacturing a semiconductor device of FIGS. 4 and 5 in the second modification to the first embodiment in accordance with the present invention. As shown in FIG. 8, the cylindrically shaped preliminary chamber 4 comprises a rear part 15B and a front part 15A, wherein the front part 15A further comprises slide double doors 15A. Namely, the rear part 15B of the cylindrically shaped preliminary chamber 4 has a half-cylinder shape. The front part 15A of the cylindrically shaped preliminary chamber 4 also has a half-cylinder shape. When the slide double doors 15A are closed, the closed slide double doors 15A form the front part 15A of the half-cylinder shape. Each of the slide double doors 15A has a quarter-cylinder shape. Diametrically opposite sides of the rear part 15B of the cylindrically shaped preliminary chamber 4 has a pair of straight door rails 18A which extend diametrically but in anti-parallel directions. The slide double doors 15A are slide on the straight door rails 18A, whereby the slide double doors 15A are moved in the anti-parallel directions. The preliminary heater 5 comprises a rear heater 5B and double front heaters 5A. The rear heater 5B is provided in the front part 15A of the cylindrically shaped preliminary chamber 4. The double front heaters 5A are provided in the slide double doors 15A or the front part 15A of the cylindrically shaped preliminary chamber 4. A cylindrically shaped preliminary chamber core tube 14 is provided along an inner wall of the cylindrically shaped preliminary chamber 4. The cylindrically shaped preliminary chamber core tube 14 comprises front core tube parts 16A and a rear core tube part 16B. Each of the front core tube parts 16A has a quarter-cylinder shape. The rear core tube part 16B has a half-cylinder shape. Each of the front core tube parts 16A extends along the inner wall of the quarter-cylinder shaped slide double doors 15A of the cylindrically shaped preliminary chamber 4. The rear core tube part 16B extends along the inner wall of the half-cylinder shaped rear part 15B of the cylindrically shaped preliminary chamber 4. The front core tube parts 16A are also slide on the straight door rails 18A so that the front core tube parts 16A are so moved as united with the slide double doors 15A. A silicon carbide heat conductive tube not illustrated is provided between the cylindrically shaped preliminary chamber core tube 14 and the heater 5 for realizing a uniform heat conduction to the cylindrically shaped preliminary chamber core tube 14 circumferentially. The slide double doors 15A are opened and closed by sliding on the straight door rails 18A. When the slide double doors 15A are opened, a large opening is formed in the front side of the cylindrically shaped preliminary chamber 4, so that plural semiconductor wafers 3 are mounted on the wafer boat 6 from the opening in the front side of the cylindrically shaped preliminary chamber 4, before the slide double doors 15A are then closed. The stutter 11 is then opened to move the wafer boat 6 mounting the plural semiconductor wafers 3 from the cylindrically shaped preliminary chamber 4 to the cylindrically shaped main chamber 1 by the boat elevator 8 before the shutter 11 is closed for subsequently carrying our the required heat treatment to the semiconductor wafers 3 or the deposition process for forming the polysilicon film or the silicon dioxide film over the semiconductor wafer. Thereafter, the shutter 11 is again opened to move the wafer boat 6 from the cylindrically shaped main. Chamber 1 to the cylindrically shaped preliminary chamber 4 before the shutter 11 is closed. Further, the slide double doors 15A are opened to pick up the semiconductor wafers 3 from the wafer boat 6 in the cylindrically shaped preliminary chamber 4.

The above novel apparatus is so operated as follows. As shown in FIG. 4, an inert gas such as nitrogen gas is supplied through the main gas supply tube 9 to fill the cylindrically shaped main chamber 1 with the inert gas to prevent any oxidation to surfaces of the semiconductor wafers 3. The main heater 2 is operated to heat the cylindrically shaped main chamber 1 at a temperature in the range of 700–1200° C. The wafer boat 6 has already set in the cylindrically shaped preliminary chamber 4. When the slide double doors 15A are opened, a large opening is formed in the front side of the cylindrically shaped preliminary chamber 4, so that plural semiconductor wafers 3 are mounted on the wafer boat 6 from the opening in the front side of the cylindrically shaped preliminary chamber 4, before the slide double doors 15A are then closed. An inert gas such as nitrogen gas is supplied through the preliminary gas supply tube 9A to fill the cylindrically shaped preliminary chamber 4 with the inert gas to prevent any oxidation to surfaces of the semiconductor wafers 3. The preliminary heater 4 is operated to heat the cylindrically shaped preliminary chamber 1 up to substantially the same temperature as the cylindrically shaped main chamber 1. Any excess gas in the cylindrically shaped preliminary chamber 4 is concurrently discharged through the preliminary discharge tube 10.

As shown in FIG. 5, after the cylindrically shaped preliminary chamber 4 is heated up to substantially the same temperature as the cylindrically shaped main chamber 1, the stutter 11 is then opened. The boat elevator 8 is operated to move the wafer boat 6 from the cylindrically shaped preliminary chamber 4 to the cylindrically shaped main chamber 1 . The shutter 11 is closed. Necessary reaction gases or source gases are supplied to the cylindrically shaped main chamber 1 for subsequently carrying our the required heat treatment to the semiconductor wafers 3 or the deposition process for forming the polysilicon film or the silicon dioxide film over the semiconductor wafer 3. Thereafter, the shutter 11 is again opened to move the wafer boat 6 from the cylindrically shaped main chamber 1 to the cylindrically shaped preliminary chamber 4 before the shutter 11 is closed. The temperature of the cylindrically shaped preliminary chamber 4 is dropped to a room temperature. Further, the slide double doors 15A are opened to pick up the semiconductor wafers 3 from the wafer boat 6 in the cylindrically shaped preliminary chamber 4.

In the above description, the semiconductor wafers 3 are subjected to the heat treatment in the cylindrically shaped main chamber 1. It is possible that the semiconductor wafers 3 are subjected to a deposition process such as chemical vapor deposition process with heating the wafers to deposit insulating layers or polysilicon layers over the semiconductor wafers.

Since the main chamber 1 comprises the quartz cylinder and the heater 2 is ring-shaped heater, a thermal sectioned-uniformity of the main chamber 1 is kept high so that a variation in temperature over circumferential position of the cylindrically shaped chamber 1 is suppressed within ±1° C.

Further, the doors of the cylindrically shaped preliminary chamber 4 are of the slide double doors 15A, thereby causing no substantive increase in the size of the apparatus.

Furthermore, the provision of the single cylindrically shaped preliminary chamber 4 under the main chamber 1 causes no substantive increase in the height from the conventional apparatus.

Moreover, the single cylindrically shaped preliminary chamber 4 is filled with the inert gas and also heated up to substantially the same temperature as the main chamber 1 before the wafer boat 6 is introduced from the cylindrically shaped preliminary chamber 4 to the main chamber 1 for subsequent heat treatment to the wafers 3 in the main chamber 1, and thereafter, the wafer boat 6 is moved to the preliminary chamber 4 for subsequent cool down the preliminary chamber 4 to room temperature, whereby the amounts of the heat, which the individual semiconductor wafers receive, are made uniform.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. An apparatus for manufacturing semiconductor devices, comprising:

a main chamber with a main heater for heating said main chamber; and a single preliminary chamber being cylindrically shaped and being provided under said main chamber, said single preliminary chamber being separated by a shutter from said main chamber, and said single preliminary chamber having a preliminary heater for heating said single preliminary chamber, said single preliminary chamber having at least a pair of doors which form a part of said single preliminary chamber.

2. The apparatus as claimed in claim 1, wherein said single preliminary chamber comprises a first half-cylinder shaped part and a second half-cylinder shaped part, and said at least one pair of doors forms said second half-cylinder shaped part.

3. The apparatus as claimed in claim 2, wherein at least one pair of hinges is further provided at opposite sides of said first half-cylinder shaped part for connecting said at least one pair of doors to said opposite sides of said first half-cylinder shaped part, so that said at least one pair of doors are hinged to said first half-cylinder shaped part.

4. The apparatus as claimed in claim 2, wherein at least one pair of arched door rails is further provided along said second half-cylinder shaped part for allowing said at least one pair of doors to slide on said arched door rails, so that said at least one pair of doors are movable around said first half-cylinder shaped part to open said at least one pair of doors.

5. The apparatus as claimed in claim 2, wherein at least one pair of straight door rails is further provided at opposite sides of said first half-cylinder shaped part and extends in diametrical and anti-parallel directions for allowing said at least one pair of doors to slide on said straight door rails, so that said at least one pair of doors are movable in said diametrical and anti-parallel directions.

6. The apparatus as claimed in claim 1, wherein said preliminary heater is capable of heating said single preliminary chamber up to substantially the same temperature as said main chamber.

7. The apparatus as claimed in claim 1, wherein said preliminary heater is provided around a side wall of said single preliminary chamber.

8. The apparatus as claimed in claim 1, wherein said semiconductor wafers are mounted on a wafer boat which is moved by a boat elevator between said main clamber and said preliminary chamber, and said at least one pair of doors is opened to allow said semiconductor wafers are picked up from said wafer boat set in said preliminary chamber.

* * * * *